(12) United States Patent
Yu et al.

(10) Patent No.: US 9,214,762 B2
(45) Date of Patent: Dec. 15, 2015

(54) ELECTRICAL CONNECTOR WITH MOUNTING BLOCK FOR ASSEMBLING CONTACT

(71) Applicant: ALLTOP ELECTRONICS (SUZHOU) LTD., Taicang, JiangSu Province (CN)

(72) Inventors: Wang-I Yu, Jhonghe (TW); Hung-Chi Tai, Jhonghe (TW); Kuo-Cheng Liu, Jhonghe (TW)

(73) Assignee: ALLTOP ELECTRONICS (SUZHOU) LTD., Taicang, JiangSu Province (CN)

( * ) Notice: Subject to any disclaimer, the term of this patent is extended or adjusted under 35 U.S.C. 154(b) by 31 days.

(21) Appl. No.: 14/283,419

(22) Filed: May 21, 2014

(65) Prior Publication Data

US 2015/0249301 A1 Sep. 3, 2015

(30) Foreign Application Priority Data

Feb. 28, 2014 (CN) .......................... 2014 1 0070567

(51) Int. Cl.
| | |
|---|---|
| H01L 23/32 | (2006.01) |
| H01R 13/62 | (2006.01) |
| H01R 13/64 | (2006.01) |
| H01R 13/514 | (2006.01) |
| H01R 13/648 | (2006.01) |
| H01R 13/115 | (2006.01) |
| H01R 24/28 | (2011.01) |

(52) U.S. Cl.
CPC ............... *H01R 13/62* (2013.01); *H01L 23/32* (2013.01); *H01R 13/115* (2013.01); *H01R 13/514* (2013.01); *H01R 13/64* (2013.01); *H01R 13/648* (2013.01); *H01R 24/28* (2013.01)

(58) Field of Classification Search
CPC ........ H01L 23/32; H01R 13/62; H01R 13/64; H01R 13/514; H01R 13/648; H01R 13/115
See application file for complete search history.

(56) References Cited

U.S. PATENT DOCUMENTS

2010/0197166 A1* 8/2010 Ngo .............................. 439/552
2015/0200484 A1* 7/2015 Randolph et al.

* cited by examiner

*Primary Examiner* — Phat X Cao
(74) *Attorney, Agent, or Firm* — Sughrue Mion, PLLC

(57) ABSTRACT

A connector includes a housing, a mounting block assembled to the housing and a first contact inserted into the mounting block and the housing. The housing includes a receiving space and a first through hole in communication with the receiving space. The mounting block is assembled in the receiving space and includes a second through hole which is aligned with the first through hole. The first contact is inserted into the second through hole and the first through hole in sequence along a rear-to-front direction. The first contact includes an elastic member and the housing and/or the mounting block comprise a stop surface to resist against the elastic member for position restriction.

20 Claims, 9 Drawing Sheets

ELECTRICAL CONNECTOR WITH MOUNTING BLOCK FOR ASSEMBLING CONTACT

BACKGROUND

1. Technical Field

The present disclosure relates to an electrical connector, and more particularly to an electrical connector with a mounting block for preventing contacts from dropping out.

2. Description Of Related Art

With rapid development of electronic technologies, electrical connectors have been widely used in electronic devices for exchanging information and/or conveying power. A conventional cable connector usually includes an insulative housing, a plurality of contacts received in the insulative housing and a plurality of cables connected to the contacts. In mating with a complementary connector, if the contacts are not well maintained in the insulative housing, the contacts might drop out. In order to solve this problem, the conventional contact is usually provided with an inclined elastic beam and the insulative housing defines a restricting slot for accommodating and abutting against the elastic beam. As a result, the contact can be prevented from dropping out.

However, with forming the restricting slot, the structure of the insulative housing might be more complex. Besides, under some conditions, if the contacts are arranged in lines and rows, the insulative housing needs to form many layers of restricting slots, which leads to very difficult manufacture and low yields.

SUMMARY

The present disclosure includes an electrical connector including an insulative housing, a mounting block assembled to the insulative housing and a first contact inserted into the mounting block and the insulative housing. The insulative housing includes a front mating surface, a rear mounting surface opposite to the front mating surface, a receiving space extending backwardly through the rear mounting surface, and a first through hole extending forwardly through the front mating surface and in communication with the receiving space. The mounting block is assembled in the receiving space and includes a second through hole which is in alignment with the first through hole along a front-to-rear direction. The first contact is inserted into the second through hole and the first through hole in sequence along a rear-to-front direction after the mounting block has been assembled in the receiving space. The first contact includes an elastic member and the insultive housing and/or the mounting block comprise a stop surface to resist against the elastic member so that the first contact can be prevented from dropping out along the front-to-rear direction.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

The components in the drawing are not necessarily drawn to scale, the emphasis instead being placed upon clearly illustrating the principles of the described embodiments. In the drawings, reference numerals designate corresponding parts throughout various views, and all the views are schematic.

DETAILED DESCRIPTION OF THE ILLUSTRATED EMBODIMENT

Figure 1:
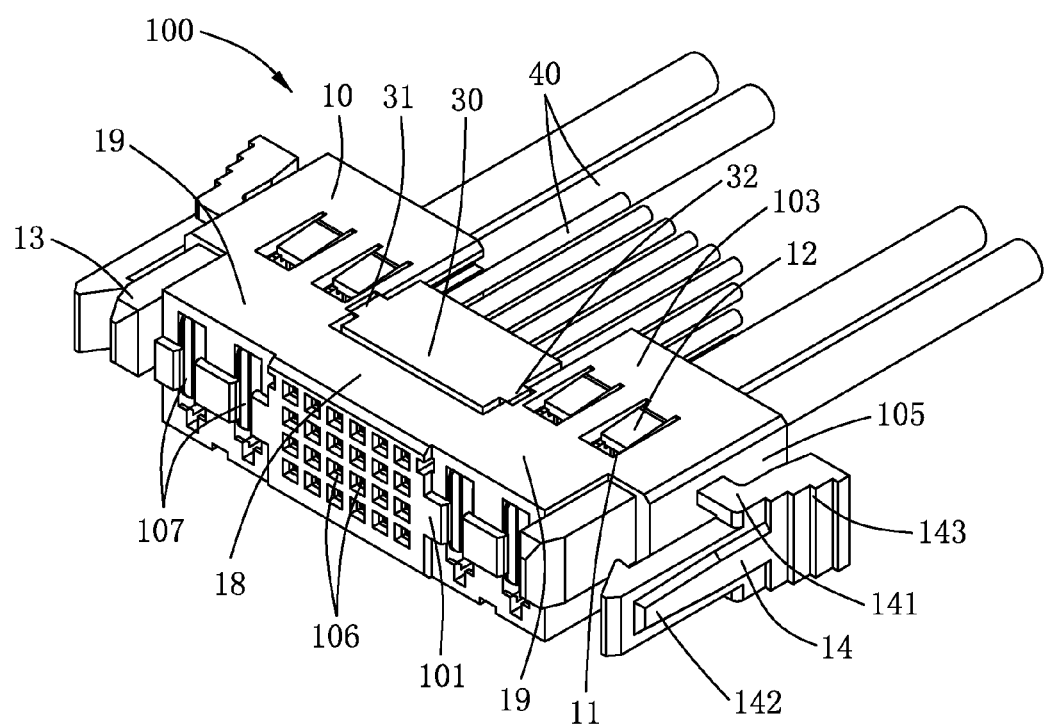
FIG. 1 is a perspective view of an electrical connector in accordance with an illustrated embodiment of the present diclosure.

Reference will now be made to the drawing figures to describe the embodiments of the present disclosure in detail. In the following description, the same drawing reference numerals are used for the same elements in different drawings.

Referring to FIGS. 1 to 11, an illustrated embodiment of the present disclosure discloses an electrical connector 100 which includes an insulative housing 10, a mounting block 30 fixed to the insulative housing 10, a plurality of contacts 20 assembled in the mounting block 30 and the insulative housing 10, and a plurality of cables 40 electrically and mechanically connected to the contacts 20. The contacts 20 of the illustrated embodiment include a plurality of first/signal contacts 21 arranged in matrix and a plurality of second/power contacts 22 arranged at opposite sides of the first/signal contacts 21. However, the first contacts 21 and the second contacts 22 can be arranged in other forms according to different requirements.

Referring to FIGS. 1 to 4, 10 and 11, the insulative housing 10 is U-shaped and includes a middle portion 18, a pair of side portions 19 connected at opposite sides of the middle portion 18 and a receiving space 15 formed between the pair of side portions 19. Besides, the insulative housing 10 includes a front mating surface 101, a rear mounting surface 102 opposite to the front mating surface 101, a top surface 103 connecting the front mating surface 101 and the rear mounting surface 102, and a bottom surface 104 opposite to the top surface 103. The receiving space 15 extends backwardly through the rear mounting surface 102 and extends upwardly through the top surface 103. The middle portion 18 includes a plurality of first through holes 106 arranged in matrix and a plurality of first slits 17 at bottoms of and in communication with corresponding first through holes 106. Concurrently, in forming the first slits 17, the middle portion 18 forms a plurality of first bottom surfaces 173 upwardly exposed to corresponding first slits 17. The first through holes 106 are in communication with the receiving space 15.

Figure 10:
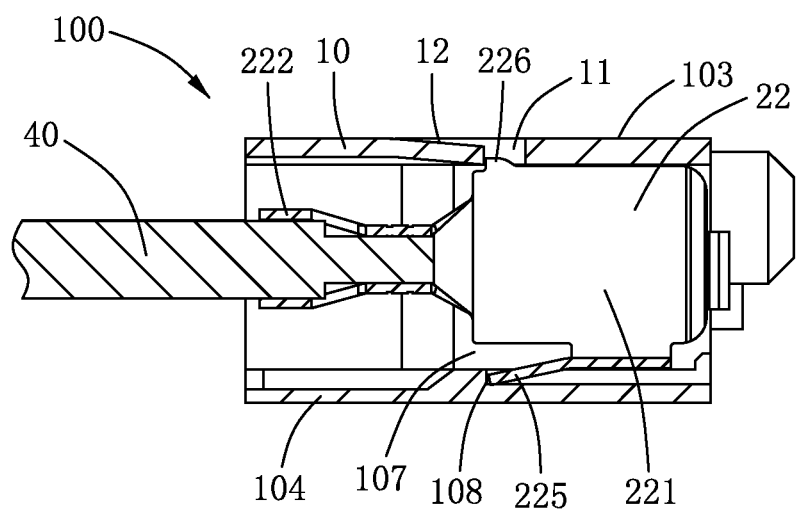
FIG. 10 is a cross-sectional view of the electrical connector showing one of the second contacts maintained in the insulative housing.

As shown in FIG. 10, each side portion 19 includes a pair of receiving slots 107 and a pair of locking walls 108 corresponding to the receiving slots 107. A top wall of each side portion 19 includes a plurality of holes 11 in communication with corresponding receiving slots 107 and a plurality of cantilevered arms 12 extending forwardly into corresponding holes 11. The cantilevered arms 12 are used to engage with the second contacts 22 in order to prevent the second contacts 22 from dropping out. Besides, each side portion 19 includes a guiding post 13 extending forwardly beyond the front mating surface 101 for mating with a complementary connector (not shown). Furthermore, each side portion 19 includes a side wall 105 and a locking member 14 adjacent to the side wall 105. As shown in FIG. 1, each locking member 14 includes a connecting portion 141 connected to corresponding side wall 105, a rear pressing portion 143 for deforming the locking member 14 and a front distal hook 142 for locking with the complementary connector.

Figure 2:
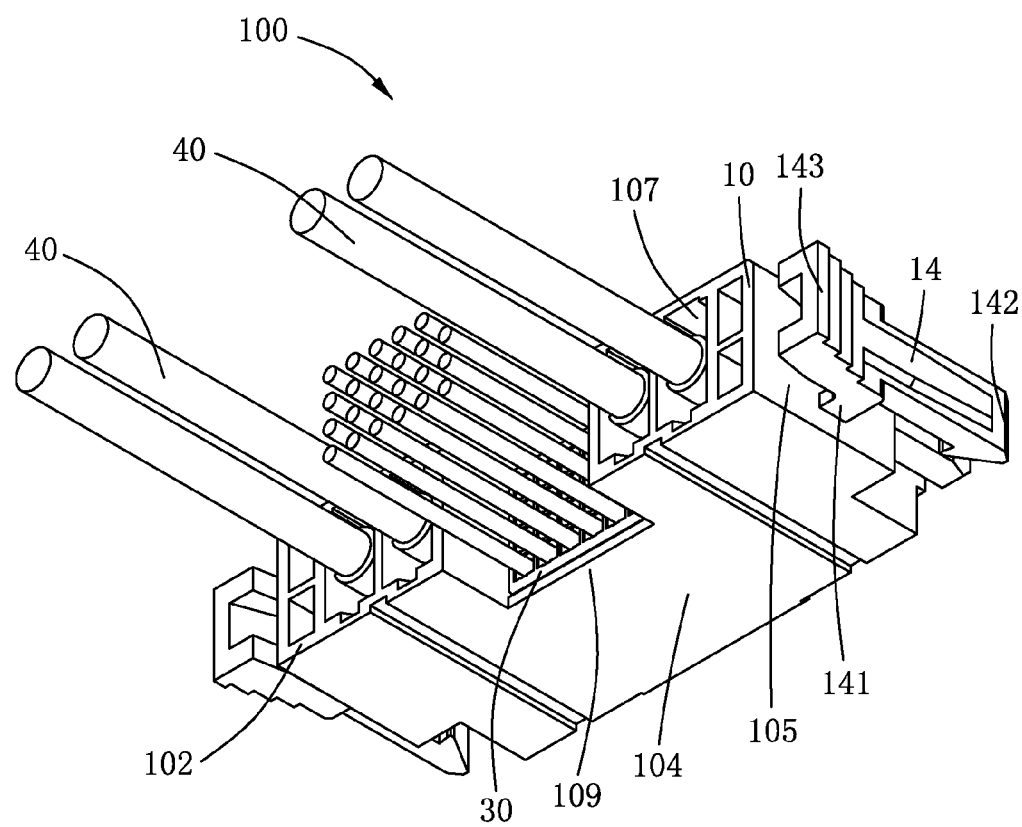
FIG. 2 is another perspective view of the electrical connector as shown in FIG. 1.
Figure 3:
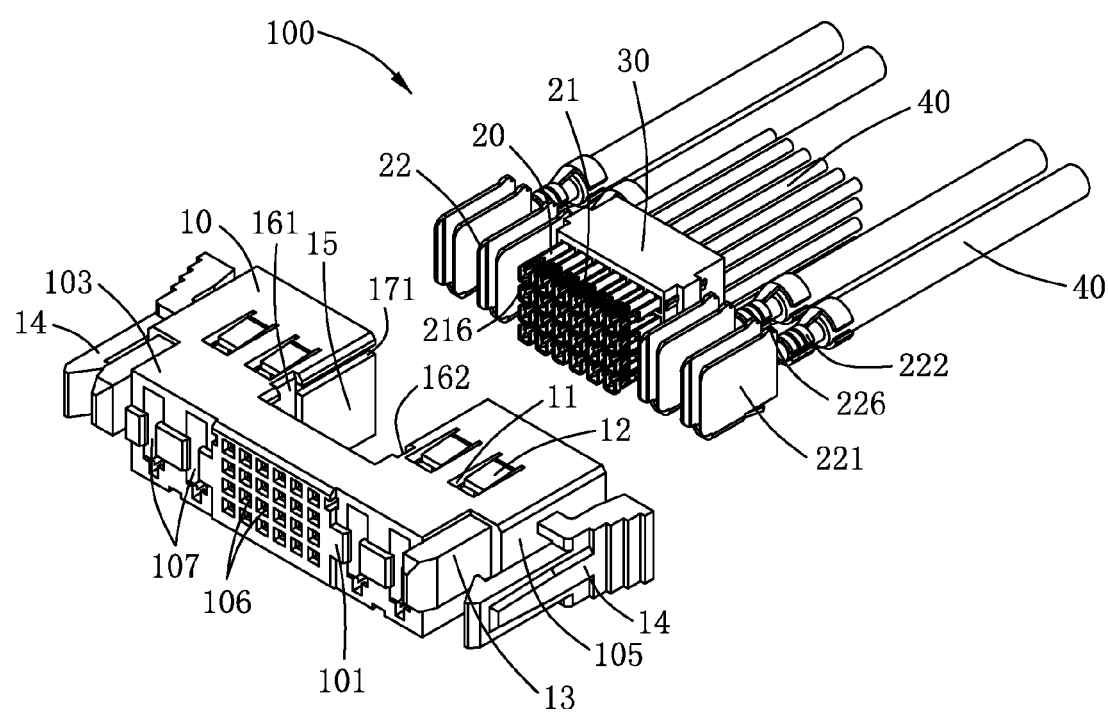
FIG. 3 is an exploded view of the electrical connector as shown in FIG. 1.
Figure 4:
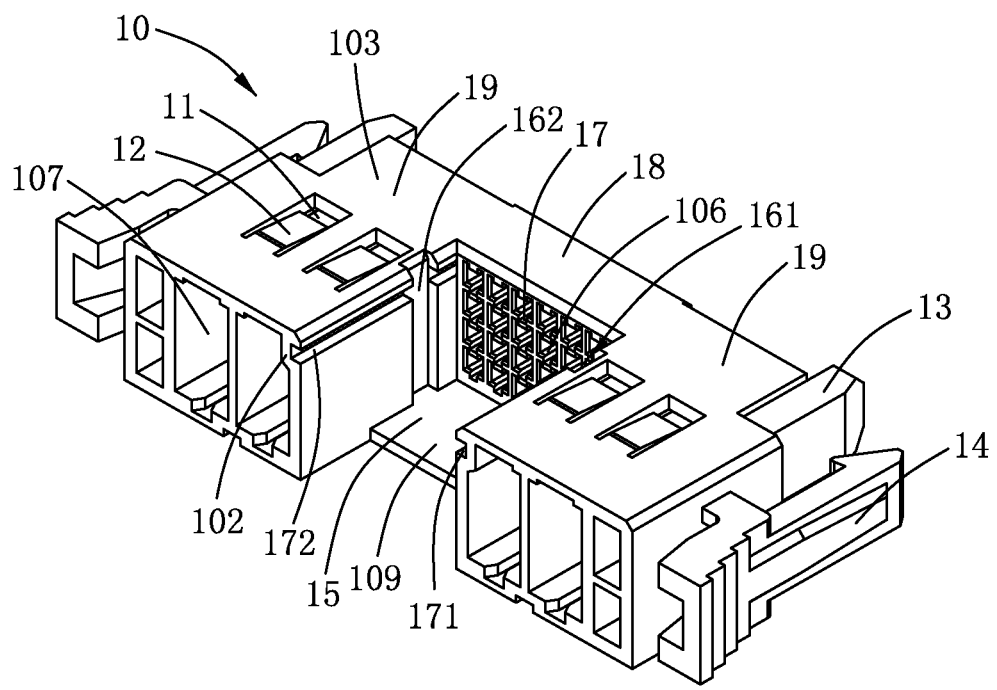
FIG. 4 is a perspective view of an insulative housing as shown in FIG. 2.
Figure 5:
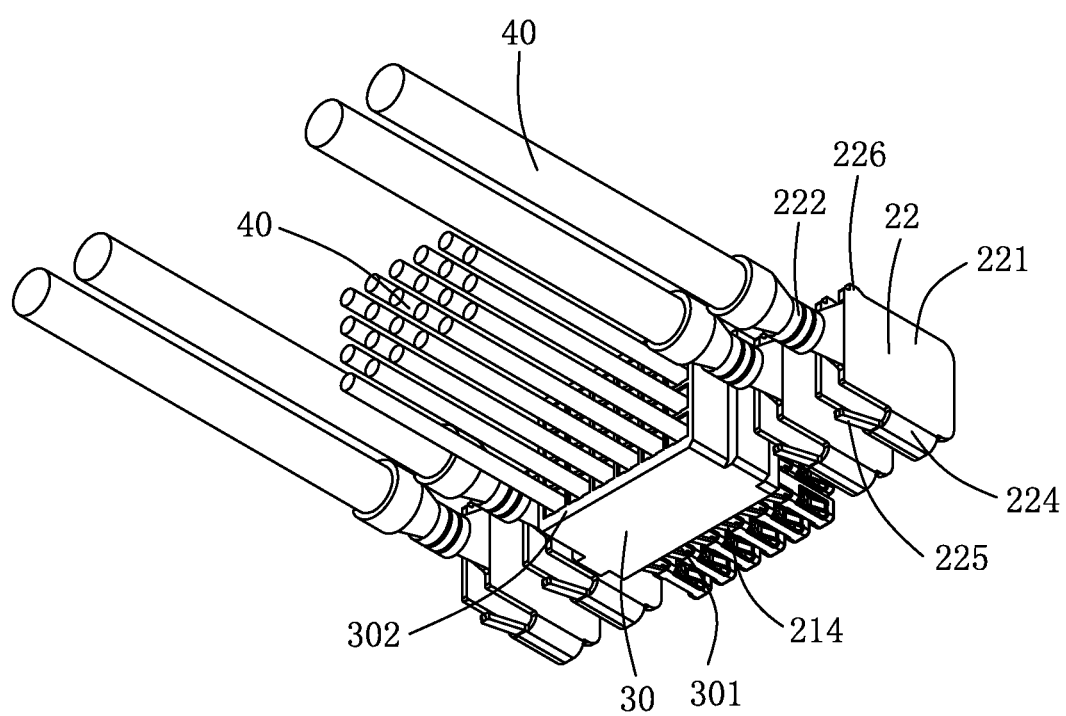
FIG. 5 is a partly exploded view of the electrical connector as shown in FIG. 2 with the insulative housing removed therefrom.

Referring to FIGS. 1 to 4, the insulative housing 10 includes a first slot 161 and a second slot 162 at lateral sides of the receiving space 15. The first slot 161 and the second slot 162 have different width. The first slot 161 and the second slot 162 extend along a vertical direction and extend upwardly through the top surface 103. Besides, the insulative housing 10 includes a first groove 171 adjacent to the first slot 161 and a second groove 172 adjacent to the second slot 162. The first groove 171 and the second groove 172 extend along a front-to-rear direction which is perpendicular to the vertical direction. As shown in FIG. 2, the insulative housing 10 includes a bottom plate 109 at the bottom of the receiving space 15 for supporting the mounting block 30.

Figure 6:
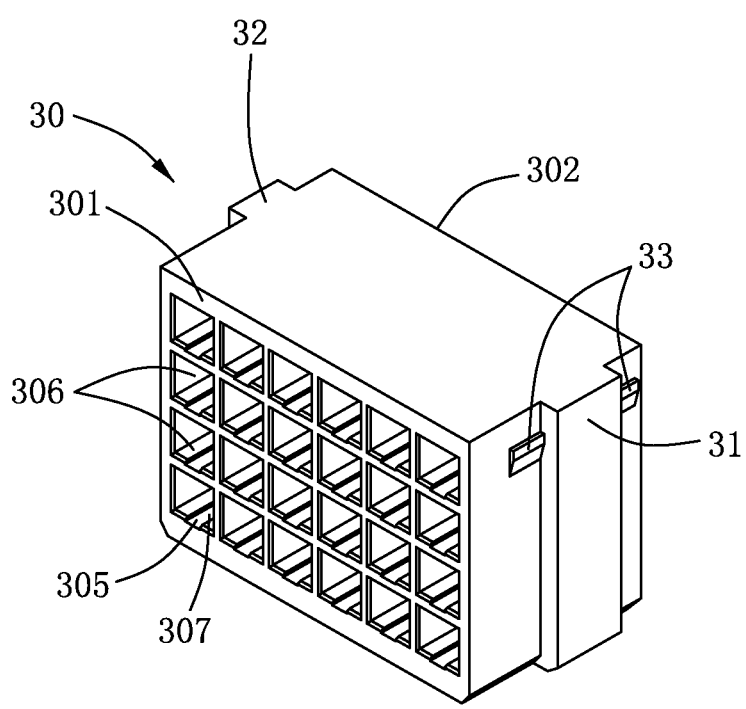
FIG. 6 is a perspective view of a mounting block as shown in FIG. 1.
Figure 7:
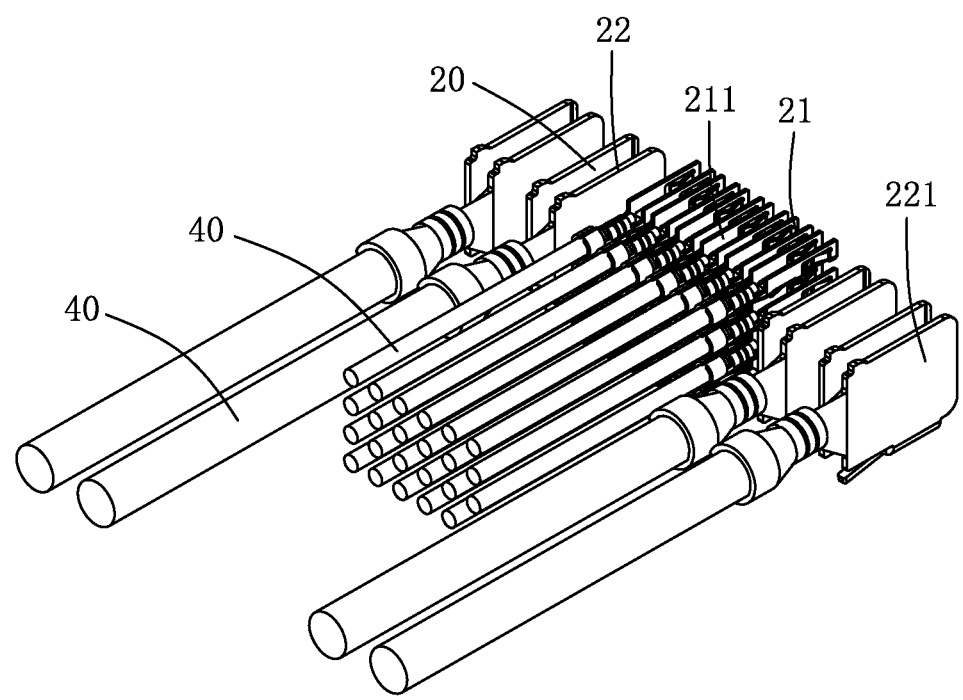
FIG. 7 is a perspective view of contacts and cables in connection with each other.
Figure 8:
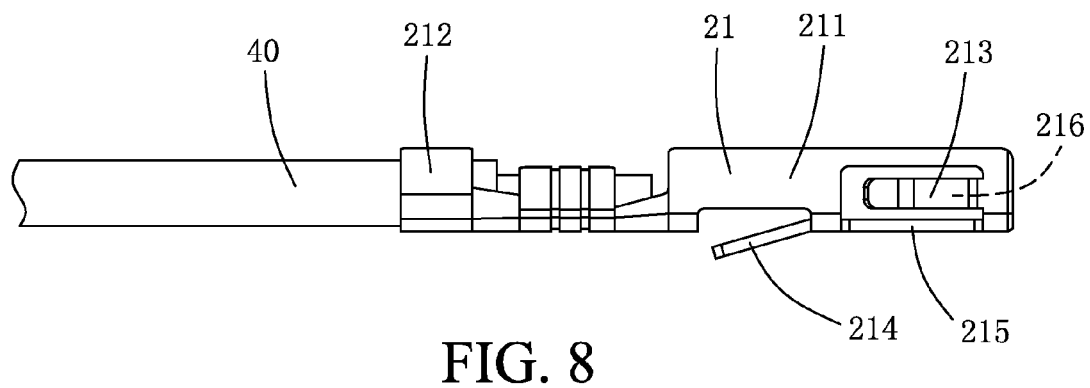
FIG. 8 is a side view of one of the first contacts as shown in FIG. 1.
Figure 9:
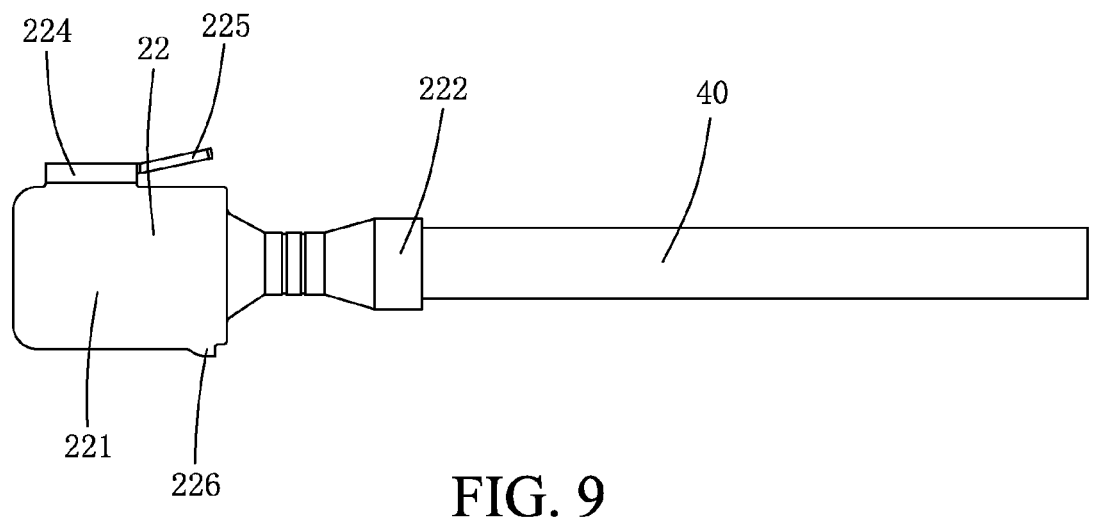
FIG. 9 is a side view of one of the second contacts as shown in FIG. 1.
Figure 11:
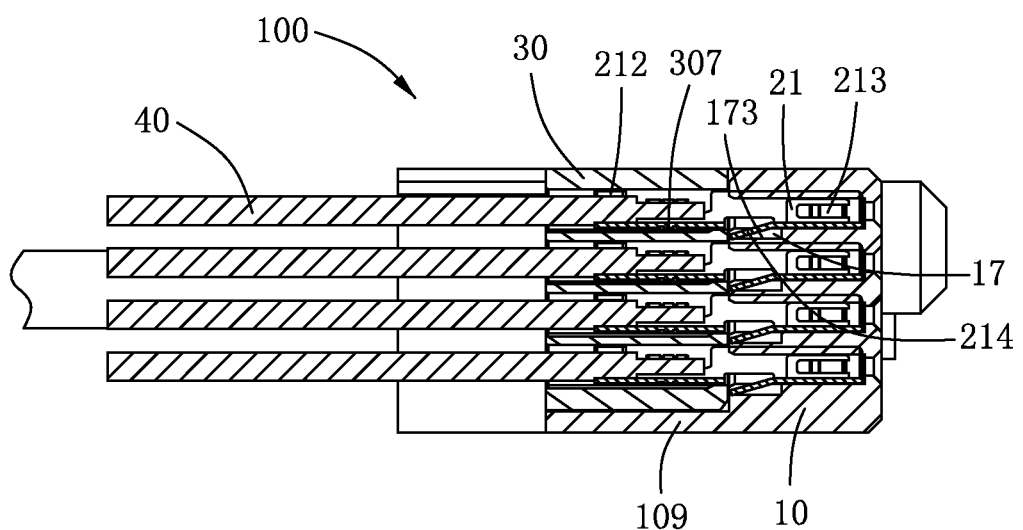
FIG. 11 is another cross-sectional view of the electrical connector showing a line of the first contacts maintained in the insulative housing.

Referring to FIGS. 1, 2 and 6, the mounting block 30 includes a front surface 301, a rear surface 302 opposite to the front surface 301, a plurality of second through holes 306 extending through the front surface 301 and the rear surface 302, and a plurality of second slits 305 at bottoms of and in communication with corresponding second through holes 306. Concurrently, in forming the second slits 305, the mounting block 30 forms a plurality of second bottom surfaces 307 upwardly exposed to corresponding second slits 305. As shown in FIG. 11, the first bottom surfaces 173 and corresponding second bottom surfaces 307 are of stepped configurations. The second through holes 306 are arranged in matrix and are in alignment of the first through holes 106 along the front-to-rear direction. Besides, the mounting block 30 includes a first protrusion 31 and a second protrusion 32 formed on two lateral sides thereof. The first protrusion 31 and the second protrusion 32 are unsymmetrical with each other so that it cannot be incorrectly assembled in the insulative housing 10. According to the illustrated embodiment of the present disclosure, the first protrusion 31 and the second protrusion 32 have different width measured along the front-to-rear direction. As shown in FIG. 6, the mounting block 30 includes a pair of first blocks 33 at opposite sides of the first protrusion 31 and a pair of second blocks (not shown, but similar to the first blocks 33) at opposite sides of the second protrusion 32.

In assembling, the mounting block 30 is assembled into the receiving space 15 along a top-to-bottom direction. The first protrusion 31 and the second protrusion 32 are inserted into the first slot 161 and the second slot 162, respectively. Once the mounting block 30 is assembled in position, it is upwardly supported by the bottom plate 109. Simultaneously, the first blocks 33 and the second blocks are locked in the first groove 171 and the second groove 172, respectively, so as to restrict upward movement of the mounting block 30. Since the second slot 162 is narrower than the first protrusion 31, the first protrusion 31 can be prevented from being incorrectly inserted into the second slot 162.

Referring to FIGS. 3, 5, 7, 8 and 11, each first contact 21 is made of metal materials and includes a pair of first vertical mating plates 211, a first connecting wall 215 connecting the pair of first vertical mating plates 211, a first clip 212 for connecting corresponding cable 40, and an elastic member 214 slantwise extending from the first connecting wall 215. Besides, the first contact includes an intermediate space 216 between the pair of first vertical mating plates 211. Each first vertical mating plate 211 includes an elastic engaging arm 213 sidewardly protruding into the intermediate space 216 for mating with the complementary connector.

Referring to FIGS. 3, 5, 7, 9 and 10, each second contact 22 is made of metal materials and includes a pair of second vertical mating plates 221, a second connecting wall 224 connecting the pair of second vertical mating plates 221, a second clip 222 for connecting corresponding cable 40, and an elastic member 225 slantwise extending from the second connecting wall 224. Besides, each second vertical mating plate 221 includes a projection 226 extending upwardly. Once the second contacts 22 are assembled into the receiving slots 107 along a rear-to-front direction in position, the projections 226 are in locking with distal ends of corresponding cantilevered arms 12 (as shown in FIG. 10). Simultaneously, the elastic members 225 engage with corresponding locking walls 108 for position restriction. As a result, the second contacts 22 can be securely maintained in the insulative housing 10.

In assembling, after the mounting block 30 has been assembled into the receiving space 15, the first contacts 21 are then inserted into the second through holes 306 and the first through holes 106 in sequence. The insulative housing 10 and/or the mounting block 30 include a stop surface to resist against the elastic member 214 so that each first contact 21 can be prevented from dropping out along the front-to-rear direction. According to the illustrated embodiment of the present disclosure, the front surface 301 of the mounting block 30 acts as the stop surface. During assembling the first contacts 21, the elastic members 214 are slidable from the second slits 305 to be ultimately received in the first slits 17 (as shown in FIG. 11). With the front surface 301 of the mounting block 30 engaging with the elastic members 214, the structure of the insulative housing 10 can be simplified for lower cost, and it is convenience to assemble the first contacts 21 with high yields.

It is to be understood, however, that even though numerous characteristics and advantages of preferred and exemplary embodiments have been set out in the foregoing description, together with details of the structures and functions of the embodiments, the disclosure is illustrative only; and that changes may be made in detail within the principles of present disclosure to the full extent indicated by the broadest general meaning of the terms in which the appended claims are expressed.

What is claimed is:

1. An electrical connector comprising:
   an insulative housing comprising a front mating surface, a rear mounting surface opposite to the front mating surface, a receiving space extending backwardly through the rear mounting surface, and a first through hole extending forwardly through the front mating surface and in communication with the receiving space;
   a mounting block assembled in the receiving space and comprising a second through hole which is in alignment with the first through hole along a front-to-rear direction; and a first contact inserted into the second through hole and the first through hole in sequence along a rear-to-front direction after the mounting block has been assembled in the receiving space; wherein the first contact comprises an elastic member and the insulative housing and/or the mounting block comprise a stop surface to resist against the elastic member so that the first contact can be prevented from dropping out along the front-to-rear direction.

2. The electrical connector as claimed in claim 1, wherein the insulative housing comprises a top surface through which the receiving space extends, the mounting block being assembled into the receiving space along a top-to-bottom direction perpendicular to the front-to-rear direction.

3. The electrical connector as claimed in claim 2, wherein the mounting block comprises a first protrusion and a second protrusion formed on opposite lateral sides thereof, the first protrusion and the second protrusion being unsymmetrical with each other, the insulative housing comprising a first slot to receive the first protrusion and a second slot to receive the second protrusion.

4. The electrical connector as claimed in claim 3, wherein the first protrusion and the second protrusion have different width measured along the front-to-rear direction, the second slot being narrower than the first protrusion so that the first protrusion can be prevented from being incorrectly inserted into the second slot.

5. The electrical connector as claimed in claim 3, wherein the insulative housing comprises a first groove adjacent to the first slot and a second groove adjacent to the second slot, the mounting block comprising a pair of first blocks formed at opposite sides of the first protrusion and a pair of second blocks formed at opposite sides of the second protrusion, the first blocks and the second blocks being locked in the first groove and the second groove, respectively, so as to restrict upward movement of the mounting block.

6. The electrical connector as claimed in claim 5, wherein each of the first groove and the second groove extends along a front-to-rear direction and is perpendicular to the first slot and the second slot.

7. The electrical connector as claimed in claim 1, wherein the mounting block includes a front surface acting as the stop surface and a rear surface opposite to the front surface, the second through hole extending through the front surface and the rear surface.

8. The electrical connector as claimed in claim 7, wherein the first contact comprises a pair of first vertical mating plates, a first connecting wall connecting the pair of first vertical mating plates and a first clip for connecting a cable, the elastic member slantwise extending from the first connecting wall.

9. The electrical connector as claimed in claim 8, wherein the first contact comprises an intermediate space between the pair of first vertical mating plates, each first vertical mating plate comprising an elastic engaging arm sidewardly protruding into the intermediate space for mating with a complementary connector.

10. The electrical connector as claimed in claim 1, wherein the insulative housing comprises a first slit at a bottom of and in communication with the first through hole, and concurrently forming a first bottom surface upwardly exposed to the first slit; the mounting block comprising a second slit at a bottom of and in communication with the second through hole, and concurrently forming a second bottom surface upwardly exposed to the second slit; the first bottom surface and the second bottom surface jointly forming a stepped configuration, the elastic member being slidable from the second slit to be ultimately received in the first slit in assembling the first contact.

11. The electrical connector as claimed in claim 2, wherein the insulative housing comprises a bottom plate at a bottom of the receiving space, the mounting block being supported by the bottom plate when the mounting block is assembled in position.

12. An electrical connector comprising:

an insulative housing comprising a middle portion, a pair of side portions connected at opposite sides of the middle portion and a receiving space formed between the pair of side portions, the middle portion comprising a plurality of first through holes arranged in matrix, each side portion comprising a plurality of receiving slots;

a mounting block assembled into the receiving space along a vertical direction, the mounting block comprising a front surface, a rear surface and a plurality of second through holes extending through the front surface and the rear surface, the second through holes being arranged in matrix, the first through holes being in alignment with corresponding second through holes along a front-to-rear direction;

a plurality of signal contacts inserted into the second through holes and the first through holes in sequence along a rear-to-front direction; and a plurality of power contacts inserted into the receiving slots along the rear-to-front direction; wherein each signal contact comprises an elastic member resisting against the front surface of the mounting block so that the signal contacts can be prevented from dropping out along the front-to-rear direction.

13. The electrical connector as claimed in claim 12, wherein the mounting block comprises a first protrusion and a second protrusion formed on opposite lateral sides thereof, the first protrusion and the second protrusion being unsymmetrical with each other, the insulative housing comprising a first slot to receive the first protrusion and a second slot to receive the second protrusion.

14. The electrical connector as claimed in claim 13, wherein the first protrusion and the second protrusion have different width measured along the front-to-rear direction, the second slot being narrower than the first protrusion so that the first protrusion can be prevented from being incorrectly inserted into the second slot.

15. The electrical connector as claimed in claim 13, wherein the insulative housing comprises a first groove adjacent to the first slot and a second groove adjacent to the second slot, the mounting block comprising a pair of first blocks at opposite sides of the first protrusion and a pair of second blocks at opposite sides of the second protrusion, the first blocks and the second blocks being locked in the first groove and the second groove, respectively, so as to restrict upward movement of the mounting block.

16. The electrical connector as claimed in claim 12, wherein each signal contact comprises a pair of first vertical mating plates, a first connecting wall connecting the pair of first vertical mating plates and a first clip for connecting a cable, the elastic member slantwise extending from the first connecting wall.

17. The electrical connector as claimed in claim 16, wherein each signal contact comprises an intermediate space between the pair of first vertical mating plates, each first vertical mating plate comprising an elastic engaging arm sidewardly protruding into the intermediate space for mating with a complementary connectors.

18. The electrical connector as claimed in claim 12, wherein the insulative housing comprises a bottom plate at a bottom of the receiving space, the mounting block being supported by the bottom plate when the mounting block is assembled in position.

19. The electrical connector as claimed in claim 12, wherein each power contact comprises a pair of second vertical mating plates, a second connecting wall connecting the pair of second vertical mating plates and a second clip for connecting a cable.

20. The electrical connector as claimed in claim 19, wherein each second vertical mating plate comprises a projection extending upwardly, each side portion comprising a top wall which comprises a plurality of cantilevered arms, the projection abutting against a distal end of corresponding cantilevered arm so as to be prevented from dropping out.

\* \* \* \* \*